United States Patent [19]
Torii et al.

[11] Patent Number: 5,516,752
[45] Date of Patent: May 14, 1996

[54] THALLIM, BISMUTH AND LEAD CONTAINING OXIDE SUPERCONDUCTOR

[75] Inventors: Yasuko Torii; Hiroyuki Kusuhara, both of Osaka, Japan

[73] Assignee: Sumitomo Electric Industries, Ltd., Osaka, Japan

[21] Appl. No.: 158,486

[22] Filed: Nov. 29, 1993

Related U.S. Application Data

[63] Continuation of Ser. No. 852,331, Mar. 17, 1992, abandoned, which is a continuation of Ser. No. 436,011, Nov. 13, 1989, abandoned.

[30] Foreign Application Priority Data

| Nov. 11, 1988 | [JP] | Japan | 63-285538 |
| Dec. 5, 1988 | [JP] | Japan | 63-307537 |
| Dec. 5, 1988 | [JP] | Japan | 63-307538 |
| Feb. 6, 1989 | [JP] | Japan | 1-27305 |
| Feb. 15, 1989 | [JP] | Japan | 1-35661 |
| Mar. 30, 1989 | [JP] | Japan | 1-78976 |
| Sep. 27, 1989 | [JP] | Japan | 1-251105 |

[51] Int. Cl.$^6$ .......... H01L 39/12; C01G 15/00; C01G 29/00; C01G 21/00
[52] U.S. Cl. .......... 505/120; 505/782; 505/783
[58] Field of Search .......... 505/1, 776, 782, 505/783, 120; 423/593, 604, 617, 619, 624, 635, 641; 252/521; 501/123; 502/355, 354, 349, 344, 345, 341

[56] References Cited

U.S. PATENT DOCUMENTS

| 4,870,052 | 9/1989 | Engler et al. | 505/1 |
| 4,880,771 | 11/1989 | Cava et al. | 505/1 |
| 4,894,361 | 1/1990 | Subramanian | 505/1 |
| 4,988,668 | 1/1991 | Engler et al. | 423/624 |
| 5,019,553 | 5/1991 | Akimitsu et al. | 423/618 |
| 5,149,687 | 9/1992 | Galasso | 505/783 |
| 5,173,475 | 12/1992 | Takada et al. | 505/782 |
| 5,264,414 | 11/1993 | Subramanian | 505/783 |

FOREIGN PATENT DOCUMENTS

| 0324660 | 7/1989 | European Pat. Off. . | |
| 212225 | 8/1989 | Japan | 505/782 |

OTHER PUBLICATIONS

Inoue, et al, "Superconductive Transition at 120K in a Tl–Bi–Sr–Ca–Cu–O System", Jul., 1989, pp. L1167–70, Jp. Jr. App. Phy. vol. 28 No. 7.
Li, et al, "Preparation and Superconducting Properties of (Tl,Bi)Sr$_2$CaCu$_2$O$_y$," 1989, no month, Physica C 157, pp. 365–369.
"Bulk Superconductivity up to 122K in the Tl–Pb,Sr–Ca–Cu–O System", M. A. Subramanian et al, *Science*, vol. 242, No. 4876, Oct. 14, 1988.
"Superconductivity in Tl$_{1.5}$SrCaCu$_2$Ox", Nagashima et al, Japanese Journal of Applied Physics, vol. 27, No. 6, Jun. 1988, pp. L1077–L1079.
"Tl$_{1-x}$Pb$_x$CaSr$_2$Cu$_2$O$_7$: Another 1122 High-Tc Superconductor", A. K. Ganguli et al, *Physica C Superconductivity*, vol. 156 (1988) No. 5, Dec. 1, 1988, pp. 788–790.

"A New High–Tc Superconductor Containing Thallium and Its Crystal Structure: The 1212 Phase (Tl$_{1-x}$Bi$_x$)$_{1.33}$Sr$_{1.33}$Ca$_{1.33}$Cu$_2$O$_{6.67+}$S," by P. Haldar, et al, Journal of Superconductivity, vol. 1, No. 2, 1988, pp. 211–218, no month.
"A New Intermediate–T Oxide Superconductor With A Double Perovskite Structure: The 1–2–1 Phase (Tl, Bi) , (Sr,Ca)$_2$ CU$_1$O$_{4.5,\&6}$", P. Haldar et al, Dept. of Chemistry and Barnett Institute of Chemical Analysis & Materials Science, Northeastern University, Boston, Massachusetts, Materials Letters, vol. 7, No. 1.2, Aug. 1988.
Torardi, et al, "Structures of the Superconducting Oxides Tl$_2$Ba$_2$CuO$_6$ and Bi$_2$Sr$_2$CuO$_6$", Phys. Rev. B, vol. 38, No. 1, Jul. 1, 1988, pp. 225–231.
Dagani, "New Class of Superconductors Pushing Temperatures Higher," Chem. & Eng. News, May 16, 1988, pp. 24–29.
Osofsky, et al, "Thin–film high Tc superconductors prepared by a simple flash evaporation technique", Appl. Phys. Lett. 53(17), 24 Oct. 1988, pp. 1663–1664.
"New 120 K Tl–Ca–Ba–Cu–O Superconductor"–Z. Z. Sheng; W. Kiehl; J. Bennett; A. El Ali; D. Marsh; G. D. Mooney; F. Arammash; J. Smith; D. Viar; and A. M. Herman—Mar. 30, 1988. (Dept. of Physics, Univ. of Arkansas).
"A New High–T$_c$ Oxide Superconductor Without a Rare Earth Element" Hiroshi Maeda; Yoshiaki Tanaka; Masao Fukutomi; Toshihisa Asano Jan. 23, 1988—Natl. Research Institute for Metals, Tsukuba Laboratories.
"Superconductivity at 93K in a New Mixed–Phase Y–Ba–Cu–O Compound System at Ambient Pressure"–Wu, Ashburn, and Torng, Dept. of Physics, Univ. of Alabama; and Hor; Meng; Gao; Huang; Wang; and Chu, Dept. of Physics and Space Vacuum Epitaxy Center, University of Houston, Phy. Rev. Lett., 58(9), Mar. 2, 1987, pp. 908–910.
"Bulk Superconductivity at 122K in Tl(Ba, Ca)$_2$Ca$_3$Cu$_4$O$_{10.5+8}$ with Four Consecutive Copper Layers", P. Haldar, K. Chen, B. Maheswaran, A. Roig–Janicki, N. K. Jaggi, R. S. Markiewicz, B. C. Giessen–Science vol. 241–2 Sep. 1988.
"Bulk Superconductivity up to 122K in the Tl–Pb–Sr––Ca–Cu–O System" M. A. Subramanian, C. C. Torardi, J. Gopalakrishnan, P. L. Gai, J. C. Calabrese, T. R. Askew, R. B. Flippen, A. W. Sleight– Reports 249—14 Oct. 1988.
"Possible High T$_c$ Superconductivity in the Ba–La–Cu–O System J. G. Bednorz and K. A. Muller—IBM Zurich Research Laboratory", Ruschukon, Switzerland—Apr. 17, 1986.

*Primary Examiner*—Steven Bos
*Attorney, Agent, or Firm*—William L. Feeney; Kerkam, Stowell, Kondracki & Clarke

[57] ABSTRACT

Superconducting oxide material containing compound represented by the formula:

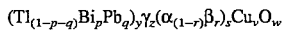

$$(Tl_{(1-p-q)}Bi_pPb_q)_y\gamma_z(\alpha_{(1-r)}\beta_r)_sCu_vO_w$$

in which each of "α" and "γ" is an element selected in IIa group of the periodic table, "β" is an element selected from a group comprising Na, K, Rb and Cs, "y", "z", "v", "w", "p", "q", "r" and "s" are numbers each satisfying respective range of $0.5 \leq y \leq 3.0$, $0.5 \leq z \leq 6.0$, $1.0 \leq v$, $5.0 \leq w$, $0 \leq p \leq 1.0$, $0 \leq q \leq 1.0$, $0 \leq r \leq 1.0$ and $0.5 \leq s \leq 3.0$.

1 Claim, 12 Drawing Sheets

THALLIUM, BISMUTH AND LEAD CONTAINING OXIDE SUPERCONDUCTOR

This is a Continuation of application Ser. No. 07/852,331, filed Mar. 17, 1992, abandoned, which is a continuation of Ser. No. 436,011, filed Nov. 13, 1989, abandoned.

BACKGROUND OF THE INVENTION

1. Field of the Invention

The present invention relates to superconducting oxide materials and processes for preparing the same. More particularly, it relates to thallium-containing superconducting oxide materials having high superconducting critical temperature (Tc) and higher superconducting critical current density (Jc) and processes for preparing the same.

2. Description of the Related Art

Discovery of new oxide type superconductor by Bednorz and Müller revealed the possibility of high temperature superconductors (Z. Phys. B64, 1986 p 189).

The new type oxide superconductor discovered by Bednorz and Müller is represented by [La, Sr]$_2$CuO$_4$ which is called the K$_2$NiF$_4$-type oxide having a crystal structure similar to known perovskite type oxides. The K$_2$NiF$_4$-type compound oxides show such higher Tc as 30 K. which are extremely higher than known superconducting materials.

C. W. Chu et al. reported another superconducting material of so-called YBCO type represented by YBa$_2$Cu$_3$O$_{7-x}$ having the critical temperature of about 90 K. (Physical Review letters, Vol. 58, No. 9, p 908). However, the critical temperature of this oxide superconductor is not so different from a boiling point 70 K. of liquid nitrogen and hence the other oxide materials which have much higher critical temperature, in other words, which have larger temperature margin have been demanded.

Maeda et al reported the other type new superconducting compound oxide of Bi—Sr—Ca—Cu—O system which show the critical temperature of more than 100 K. (Japanese Journal of Applied Physics. Vol. 27, No. 2, p 1209 to 1210).

Thallium type compound oxides are also high Tc superconductors of more than 100 K. The present inventors disclosed several kinds of thallium type compound oxides superconductors in U.S. Pat. application No. 223,634 filed on Jul. 25, 1988, now U.S. Pat. No. 4,880,773, and Hermann et al. reported Tl—Ba—Ca—Cu—O system in Appl. Phys. Lett. 52 (20) p 1738. U.S. Pat. No. 4,870,052 discloses a kind of thallium-containing oxide superconductor. Thallium type compound oxides have such a very important merit that superconductors which show such a high Tc as more than 100 K. can be obtained without using rear earth elements as a material so that the production cost can be reduced.

Although these known Tl—Ba—Ca—Cu—O system and Bi—Sr—Ca—Cu—O system oxide superconductors show very high Tco's at which the superconducting property is observed, their Tci's at which the apparent electrical resistance become zero or undetectable are such low as about 80 to 90 K. which is not so different from that of the Y$_1$Ba$_2$Cu$_3$O$_{7-x}$ system because these compound oxide superconductors contain several different phases. Still more, their critical current density values (Jc) are inferior to that of the Y$_1$Ba$_2$Cu$_3$O$_{7-x}$ system.

Still more, in the case of production of thallium type oxide superconductors, there is a special problem cause by such a fact that thallium is a very volatile element and toxic for human. In fact, it is difficult to obtain a thallium-containing oxide having a desired composition because the vapour pressure of thallium is relatively higher than the other elements. Further, the special attention must be paid to handle the material of the thallium-containing superconductor because thallium element is toxic for human.

An object of the present invention is to overcome the problems of the prior arts and to provide thallium-containing superconductors which is relatively easy to be obtained as a single phase and also which have improved superconducting properties and a method for producing the same.

SUMMARY OF THE INVENTION

The present invention provides a superconducting oxide material, characterized in that the superconducting oxide material contain compound oxide having a composition represented by the formula:

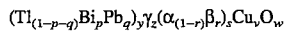

$$(Tl_{(1-p-q)}Bi_pPb_q)_y\gamma_z(\alpha_{(1-r)}\beta_r)_sCu_vO_w$$

in which each of "α" and "γ" is an element selected in IIa group of the periodic table, "β" is an element selected from a group comprising Na, K, Rb and Cs, "y", "z", "v", "w", "p", "q", "r" and "s" are numbers each satisfying respective range of $0.5 \leq y \leq 3.0$, $0.5 \leq z \leq 6.0$, $1.0 \leq v$, $5.0 \leq w$, $0 \leq p \leq 1.0$, $0 \leq q \leq 1.0$, $0 \leq r \leq 1.0$ and $0.5 \leq s \leq 3.0$.

The expression "contain" means that the superconducting oxide material according to the present invention can contain additionally or inevitably the other compound oxides. In fact, a bulk oxide superconductor usually may consist of more than one phase. Therefore, all compound oxides containing the compound oxide defined by the present invention are included in the scope of the present invention.

The present invention provides also a process for preparing the superconducting oxide material, characterized by mixing oxide powders each containing Tl, Bi, Pb, an element α, an element β, an element γ and Cu in proportions of $$Tl:Bi:Pb:\gamma:\alpha:\beta:Cu=h:i:j:k:l:m:n,$$

in which each of "α" and "γ" is an element selected in IIa group of the periodic table, "β" is an element selected from a group comprising Na, K, Rb and Cs, "h", "j", "k", "l", "m" and "n" are numbers each satisfying respective range of $0 < h \leq 3.0$, $0 \leq i < 3.0$, $0 \leq j < 3.0$, $0.5 \leq k \leq 6.0$, $0 \leq l \leq 3.0$, $0 \leq m \leq 3.0$ and $1.0 \leq n$, and then sintering the resulting powder mixture at a temperature between 820° and 950° C. for 6 to 100 hours in oxygen gas atmosphere.

An essence of the present invention reside in that the oxide superconductor according to the present invention contain a compound oxide having a layered crystal structure of a tetragonal system which has one layer of Tl—O, (Tl, Pb)—O, (Tl, Bi)—O or (Tl, Pb, Bi)—O in the crystal.

Preferable compound oxides are represented by one of the following general formulas:

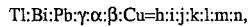

$$(Tl_{(1-q)}Pb_q)_y\gamma_z\alpha_sCu_vO_w \qquad (1)$$

in which each of "α" and "γ" is an element selected in IIa group of the periodic table, "y", "z", "v", "w", "q" and "s" are numbers each satisfying respective range of $0.5 \leq y \leq 3.0$, $0.5 \leq z \leq 6.0$, $2.0 \leq v$, $5.0 \leq w$, $0 \leq q \leq 1.0$ and $0.5 \leq s \leq 3.0$, preferably $0 < q \leq 0.5$. This compound oxide has preferably such a crystal structure as having two to six layer of CuO corresponding to v=2 to 6.

$$(Tl_{(1-p)}Bi_p)_y\alpha_sCa_zCu_vO_w \qquad (2)$$

in which "α" is Ba or Sr, "y", "z", "v", "w", "p" and "s" are numbers each satisfying respective range of $0.5 \leq y \leq 3.0$, $0.5 \leq z \leq 4.0$, $1.0 \leq v \leq 5.0$, $5.0 \leq w \leq 15.0$, $0 \leq p \leq 1.0$ and $0.5 \leq s \leq 3.0$, preferably $0.2 \leq p \leq 0.8$.

$$(Tl_{(1-p-q)}Bi_pPb_q)_y\alpha_sCa_zCu_vO_w \qquad (3)$$

in which "α" is Ba or Sr, "y", "z", "v", "w", "p", "q" and "s" are numbers each satisfying respective range of $0.5 \leq y \leq 3.0$, $0.5 \leq z \leq 4.5$, $1.0 \leq v \leq 5.0$, $5.0 \leq w \leq 15.0$, $0 \leq p \leq 1.0$, $0 \leq q \leq 0.6$ and $0.5 \leq s \leq 3.0$, preferably $0.2 \leq p \leq 0.8$.

$$Tl_yCa_z(\alpha_{(1-r)}\beta_r)_sCu_vO_w \qquad (4)$$

in which "α" is Ba or Sr, "β" is an element selected from a group comprising Na, K, Rb and Cs, "y", "z", "v", "w", "r" and "s" are numbers each satisfying respective range of $0.5 \leq y \leq 3.0$, $0.5 \leq z \leq 4.0$, $2.0 \leq v \leq 5.0$, $5.0 \leq w \leq 15.0$, $0 \leq r \leq 0.8$ and $0.5 \leq s \leq 3.0$.

$$(Tl_{(1-p-q)}Bi_pPb_q)_yCa_z(\alpha_{(1-r)}\beta_r)_sCu_vO_w \qquad (5)$$

in which "α" is Ba or Sr, "β" is an element selected from a group comprising Na, K, Rb and Cs, "y", "z", "v", "w", "p", "q", "r" and "s" are numbers each satisfying respective range of $0.5 \leq y \leq 3.0$, $0.5 \leq z \leq 4.0$, $2.0 \leq v \leq 5.0$, $5.0 \leq w \leq 15.0$, $0 \leq p \leq 0.5$, $0 \leq q \leq 0.5$, $0 \leq r \leq 0.8$ and $0.5 \leq s \leq 3.0$.

The superconducting oxide material containing the above-mentioned compound oxide according to the present invention is preferably prepared by mixing one of oxide powders consisting of the following elements listed below with their proportions and then by sintering the resulting powder mixture at a temperature between 820° and 950° C. for 6 to 100 hours in oxygen gas atmosphere:

(1) Tl:Pb:Ca:Ba:Cu=h:j:k:l:n, in which $0<h<3.0$, $0<j<3.0$, $0.5 \leq k \leq 6.0$, $0.5 \leq l \leq 3.0$ and $2.0 \leq n$, (2) Tl:Bi:Ca:Ba:Cu=h:i:k:l:n, in which $0<h<3.0$, $0<i<3.0$, $0.5 \leq k \leq 6.0$, $0.5 \leq l \leq 3.0$ and $2.0 \leq n$, (3) Tl:Bi:Ca:Sr:Cu=h:i:k:l:n, in which $0<h<3.0$, $0<i<3.0$, $0.5 \leq k \leq 6.0$, $0.5 \leq l \leq 3.0$ and $2.0 \leq n$, (4) Tl:Bi:Pb:Ca:Sr:Cu=h:i:j:k:l:n, in which $0<h<3.0$, $0 \leq i<3.0$, $0 \leq j<3.0$, $0.5 \leq k \leq 4.0$, $0.5 \leq l \leq 3.0$ and $1.0 \leq n \leq 5.0$, (5) Tl:Ca:α:β:Cu=h:k:l:m:n, in which "α" is Ba or Sr, "β" is an element selected from a group comprising Na, K, Rb and Cs and $0.5 \leq h \leq 3.0$, $0.5 \leq k \leq 4.0$, $0.1 \leq l \leq 3.0$, $0 \leq m \leq 2.4$ and $2.0 \leq n \leq 5.0$, and (6) Tl:Bi:Pb:Ca:α:β:Cu=h:i:j:k:l:m:n, in which "α" is Ba or Sr, "β" is an element selected from a group comprising Na, K, Rb and Cs and $0.5 \leq h<3.0$, $0.5 \leq i<3.0$, $0.5 \leq j<3.0$, $0.5 \leq k \leq 4.0$, $0.1 \leq l \leq 3.0$, $0 \leq m \leq 2.4$ and $2.0 \leq n \leq 5.0$.

In operation, the material powder mixture is preferably wrapped with a metallic foil made of one of precious metals such as gold or their alloys. The sintering operation can be effected in an ordinary furnace. The interior of the furnace is preferably in the condition of oxygen-rich atmosphere. The oxygen gas is preferably fed continuously into the furnace during the sintering operation preferably at a rate of more than 0.1 liter per minute at 1 atm. Usual oxygen gas pressure is about 1 atm. but the sintering can be effected also at a higher oxygen pressure than 1 atm. According to the present invention, the sintering is effected at a temperature between 820° and 950° C. When the sintering temperature is not higher than 820° C., the resulting sintered mass becomes a mixture of different phases each having different critical temperature, so that the apparent Tc of the sintered mass become lower. To the contrary, if the sintering temperature is not lower than 950° C., the evaporation of thallium increase excessively so that it is difficult to adjust the composition of the sintered mass to desired atomic ratios and also it increases precipitates which doesn't contribute the superconductivity. The sintering can be effected for a time duration between 6 to 100 hours. When the sintering time is not longer than 6 hours, the material powder mixture is not sintered satisfactorily so that a desired superconductor can not be obtained. Longer sintering time than 100 hours may not effective to improve the superconducting property.

As is described hereinabove, the oxide superconductors according to the present invention exhibit very higher critical current density than the known oxide superconductors such as Bi—Sr—Ca—Cu—O system and Tl—Sr—Ca—Cu—O system while they exhibit the same or even higher critical temperature with respect to such known oxide superconductors. It is thought that such advantage might be obtained from such facts that the oxide superconducting materials according to the present invention have a novel layered crystal structure of tetragonal system having one layer of Tl—O, (Tl, Pb)—O, (Tl, Bi)—O or (Tl, Pb, Bi)—O and that the oxide superconducting materials according to the present invention are relatively easily obtained as a single phase.

Now, the present invention will be described in more details by examples, but the scope of the present invention should not be limited to the following special examples.

EXAMPLE 1

Oxide superconducting materials according to the present invention were prepared by the process according to the present invention. Powders of $Tl_2O_3$, PbO, CaO, $BaO_2$ and CuO used as materials were mixed in such proportions that the atomic ratios of Tl:Pb:Ca:Ba:Cu in each sample became as followings:

(1) 0.8:0.2:3:1:3

(2) 0.75:0.25:3:1:3

(3) 0.8:0.2:3:1:3

(4) 0.95:0.05:3:1:3

(5) 0.95:0.05:3:1:3.

Then, each of the resulting powder mixture was compacted under a pressure of about 100 kg/cm² into a pellet. Each pellet was wrapped with a gold foil of 50 micron thick and was sintered at a fixed temperature selected from a range between 850° C. and 900° C. for about 10 hours in a furnace into which $O_2$ gas is flown at a rate of 200 ml/min to obtain an oxide superconductor according to the present invention.

The powder mixture of Sample No. 4 and 5 had the same atomic ratios but they were sintered at different sintering temperature of 870° C. (sample No. 4) and 850° C. (sample No. 5) respectively.

All of the resulting oxide superconductors were found that they contained compound oxide represented by the general formula:

$$(Tl_{(1-q)}Pb_q)_yCa_zBa_sCu_vO_w$$

in which "y", "z", "v", "w", "q" and "s" are numbers each satisfying respective range of $0.5 \leq y \leq 3.0$, $0.5 \leq z \leq 6.0$, $2.0 \leq v$, $5.0 \leq w$, $0 \leq q \leq 1.0$ and $0.5 \leq s \leq 3.0$.

Figure 7:
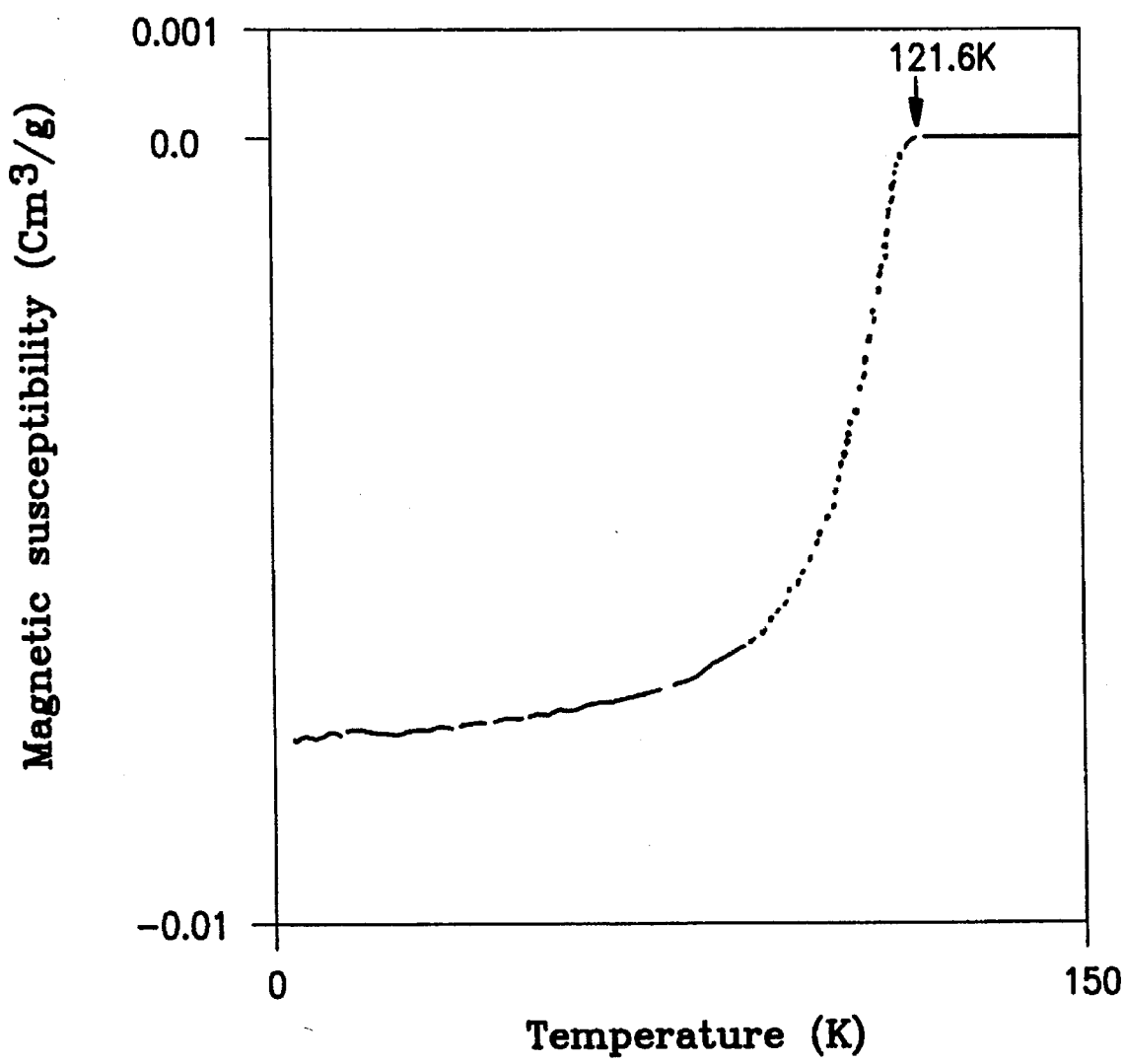
FIGS. 7 to 9 show respective temperature dependency of magnetic susceptibility of oxide superconductors (Sample No. 3 to 5) obtained in Example 1 according to the present invention.
Figure 8:
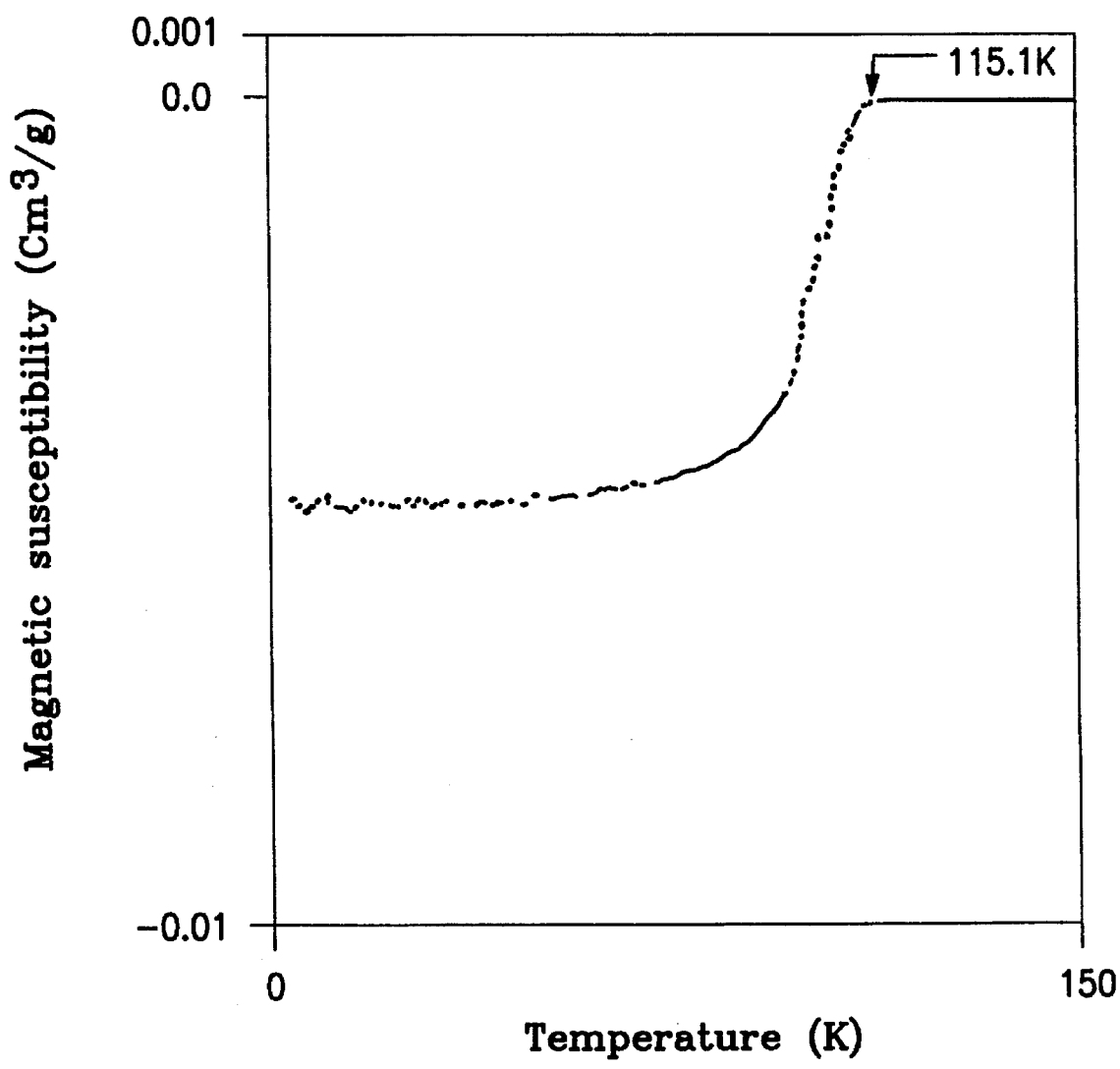
Figure 9:
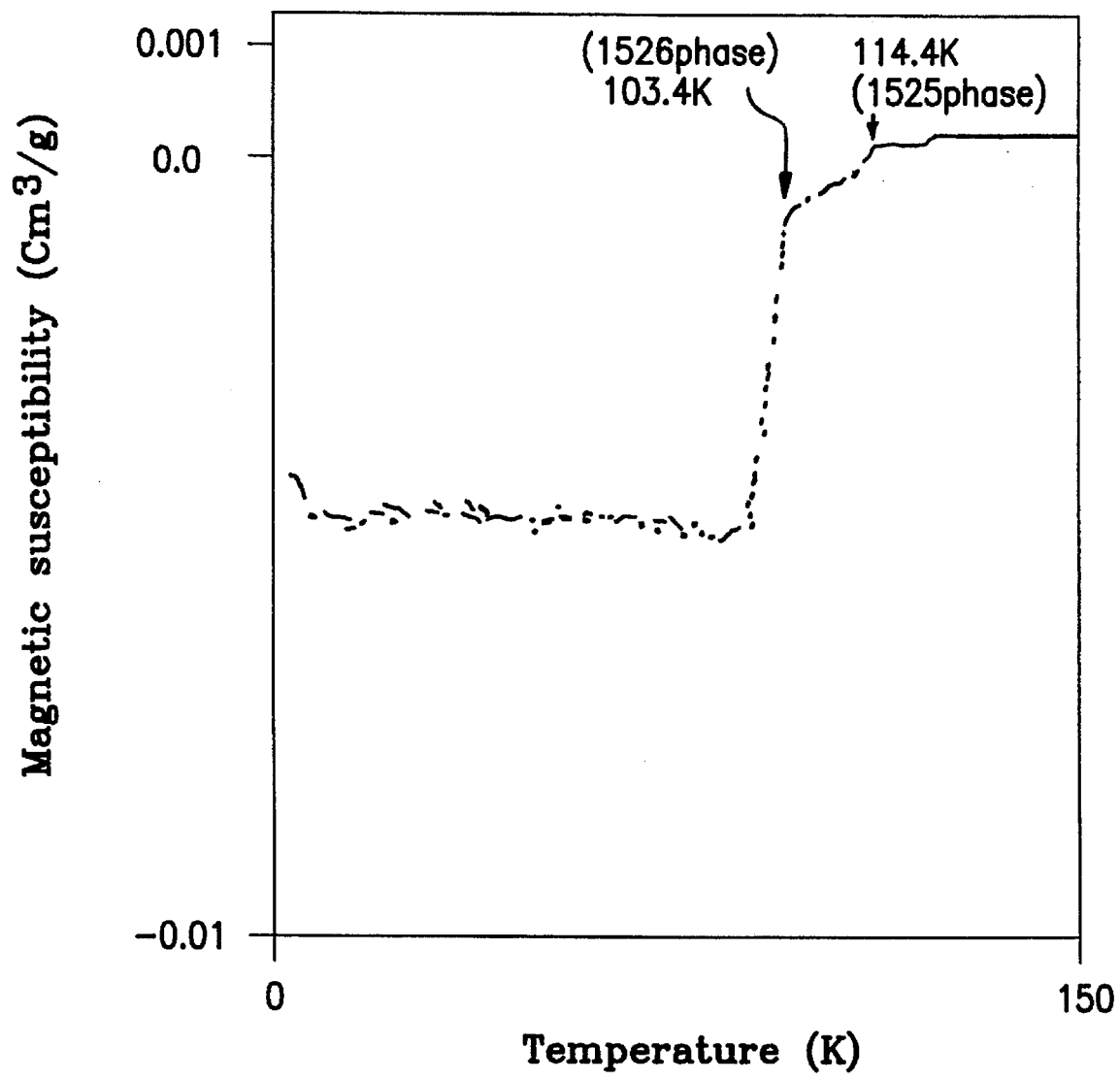

Table.1 shows the properties of each oxide superconducting material obtained and FIGS. 1 to 5 show X-ray diffraction data thereof. FIGS. 7 to 9 show the result of magnetic susceptibility measured on the samples No. 3, 4 and 5 respectively. In the composition shown in Table 1, there are such cases that the ratio of Tl to Pb and the ratio of Ca to Cu don't coincide with the theoretical values which are expected by the analysis of crystal structure because the values shown in Table 1 are measured values and conain a tolerance.

For a comparison, the coresponding properties of known superconducting materials represented by $Tl_2Ca_2Ba_2Cu_3O_{10}$ and $(Bi, Pb)_2Ca_2Sr_2Cu_3O_{10}$ are also shown in Table 1.

From the Table 1, it is apparent that the oxide superconducting material according to the present invention show higher critical current density Jc than the known oxide superconducting materials while same or even higher critical temperature Tc is observed.

CuO (purity is higher than 99.9%) used as materials were weighted and mixed in the proportions shown in Table 2 to prepare two samples of powder mixture. Then, the resulting powder mixtures were compacted into pellets. the resulting each pellet was wrapped with a gold foil and was sintered at a temperature of 870° C. for 12 hours.

The resulting two samples of oxide superconductors were found that they contained compound oxide represented by the general formula:

$$(Tl_{(1-p)}Bi_p)_yBa_sCa_zCu_vO_w$$

in which "y", "z", "v", "w", "p" and "s" are numbers each satisfying respective range of $0.5 \leq y \leq 3.0$, $0.5 \leq z \leq 4.0$, $1.0 \leq v \leq 5.0$, $5 \leq w \leq 15.0$, $0 \leq p \leq 1.0$ and $0.5 \leq s \leq 3.0$.

On the resulting oxide superconductors, the critical temperature and the critical current density at liquid nitrogen temperature were measured and X-ray diffraction charts were obtained in order to check phases produced.

For a comparison, a comparative superconducting material was prepared by sintering a powder mixture containing solely of $Tl_2O_3$, $BaO_2$, $CaO$ and $CuO$ and the superconducting properties were determined by the same method as above.

Table 2 shows the ratios of elements in the material powder mixture, the superconducting properties and the crystal structure (phase) determined by X-ray diffraction analysis including the value "y" in the general formula.

From the Table 2, it is apparent that the oxide superconducting material according to the present invention show much higher critical current density Jc than the known oxide

TABLE 1

| sample No | composition | lattice constant | Tci (K) | Jc (A/cm$^2$) |
|---|---|---|---|---|
| 1 | $(Tl, Pb)_1Ca_1Ba_2Cu_2O_7$ | a = 3.86 Å<br>c = 12.95 Å | 80 | 400 |
| 2 | $(Tl, Pb)_1Ca_2Ba_2Cu_3O_9$ | a = 3.86 Å<br>c = 16.11 Å | 102 | 410 |
| 3 | $Tl_{0.80}Pb_{0.20}Ca_{3.0}Ba_{2.0}Cu_{3.9}O_x$ | a = 3.85 Å<br>c = 19.36 Å | 121 | 520 |
| 4 | $Tl_{0.82}Pb_{0.15}Ca_{4.0}Ba_{2.0}Cu_{4.9}O_y$ | a = 3.85 Å<br>c = 22.22 Å | 113 | 470 |
| 5 | $Tl_{0.90}Pb_{0.16}Ca_{5.0}Ba_{2.0}Cu_{5.8}O_z$ | a = 3.85 Å<br>c = 25.97 Å | 102 | — |
| Comparative | | | | |
| | $Tl_2Ca_2Ba_2Cu_3O_{10}$ | | 118 | 270 |
| | $(Bi, Pb)_2Ca_2Sr_2Cu_3O_{10}$ | | 108 | 255 |

EXAMPLE 2

Oxide superconducting materials according to the present invention were prepared by the process according to the present invention. Powders of $Tl_2O_3$, $Bi_2O_3$, $BaO_2$, $CaO$ and superconducting material while same or even higher critical temperature Tc is observed.

TABLE 2

| | Composition of the powder mixture | | | | | Phase obtained | y | Tci (K) | Jc (A/cm$^2$) |
|---|---|---|---|---|---|---|---|---|---|
| | Tl | Bi | Ba | Ca | Cu | | | | |
| Example | 1.4 | 0.6 | 2 | 2 | 3 | a = 3.85 Å<br>c = 15.8 Å<br>tetragonal system | 2 | 110 | 400 |
| | 1.6 | 0.4 | 2 | 2 | 3 | same as above | 2 | 115 | 450 |

TABLE 2-continued

| | Composition of the powder mixture | | | | | Phase obtained | y | Tci (K) | Jc (A/cm²) |
|---|---|---|---|---|---|---|---|---|---|
| | Tl | Bi | Ba | Ca | Cu | | | | |
| Comparative | 2 | — | 2 | 2 | 3 | a = 3.85 Å c = 35.8 Å | — | 112 | 270 |

Note: Tci is a temperature where perfect zero resistance was observed

EXAMPLE 3

A plurality of oxide superconducting materials according to the present invention were prepared by the process according to the present invention. Powders of $Tl_2O_3$, $Bi_2O_3$, PbO, CaO, SrO and CuO (purity is higher than 99.9%) used as materials were weighted and mixed in the proportions shown in Table 3, Table 4 and Table 5 to prepare powder mixture samples. Then, the resulting powder mixture samples were compacted into pellets. The resulting each pellet was wrapped with a gold foil and was sintered at a temperature of 870° C. for 12 hours.

All of the resulting oxide superconductors were found that they contained compound oxide represented by the general formula:

$$(Tl_{(1-p)}Bi_p)_y Sr_z Ca_z Cu_v O_w$$

in which "y", "z", "v", "w", "p" and "s" are numbers each satisfying respective range of $0.5 \leq y \leq 3.0$, $0.5 \leq z \leq 4.0$, $1.0 \leq v \leq 5.0$, $5 \leq w \leq 15.0$, $0 \leq p \leq 1.0$ and $0.5 \leq s \leq 3.0$, or compound oxide represented by the general formula:

$$(Tl_{(1-p-q)}Bi_p Pb_q)_y Sr_z Ca_z Cu_v O_w$$

in which "y", "z", "v" "w" "p" "q" and "s" are numbers each satisfying respective range of $0.5 \leq y \leq 3.0$, $0.5 \leq z \leq 4.5$, $1.0 \leq v \leq 5.0$, $5.0 \leq w \leq 15.0$, $0 \leq p \leq 1.0$, $0 \leq q \leq 0.6$ and $0.5 \leq s \leq 3.0$.

On the resulting oxide superconductors, the critical temperature and the critical current density at liquid nitrogen temperature were measured and X-ray diffraction charts were obtained in order to check phases produced. The value "y" in the general formula was also determined in several samples.

From these experimental data, it was confirmed that a novel layered crystal structure of a tetragonal system having a mixed layer of Tl and Bi or a mixed layer of Tl and Pb was produced in the resulting oxide superconductor. From the analysis of the proportion of the phase obtained by X-ray diffraction chart, it was concluded that this novel phase contributes to a superconducting phase.

For a comparison, the same test as above was repeated for comparative superconducting materials which were prepared by sintering a powder mixture containing solely of $Bi_2O_3$, SrO, CaO and CuO and a powder mixture containing solely of $Bi_2O_3$, SrO, CaO, CuO and PbO.

Figure 1:
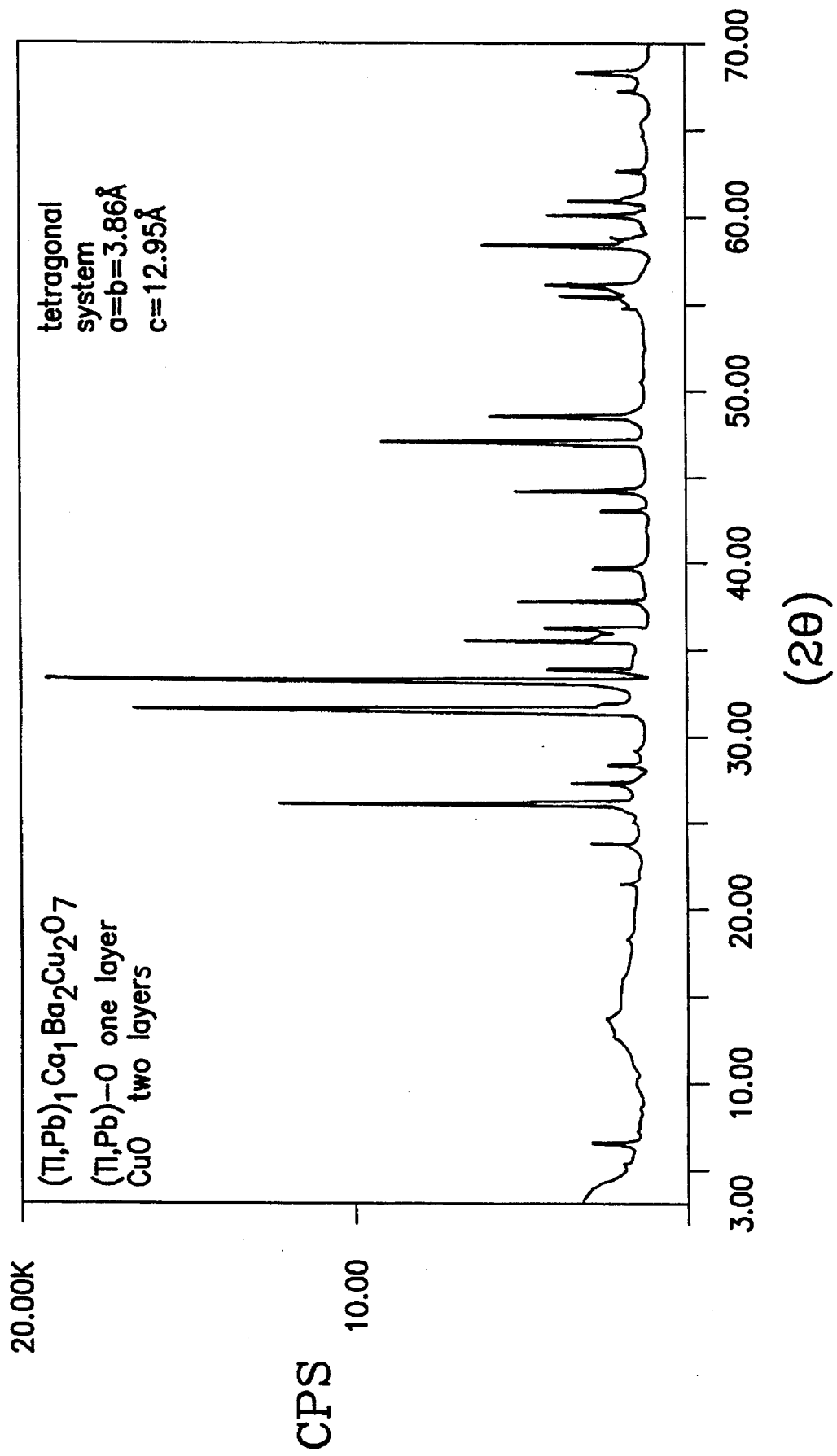
FIGS. 1 to 5 are X-ray diffraction charts of five oxide superconductors (Sample No. 1 to 5) obtained in Example 1 according to the present invention.
Figure 2:
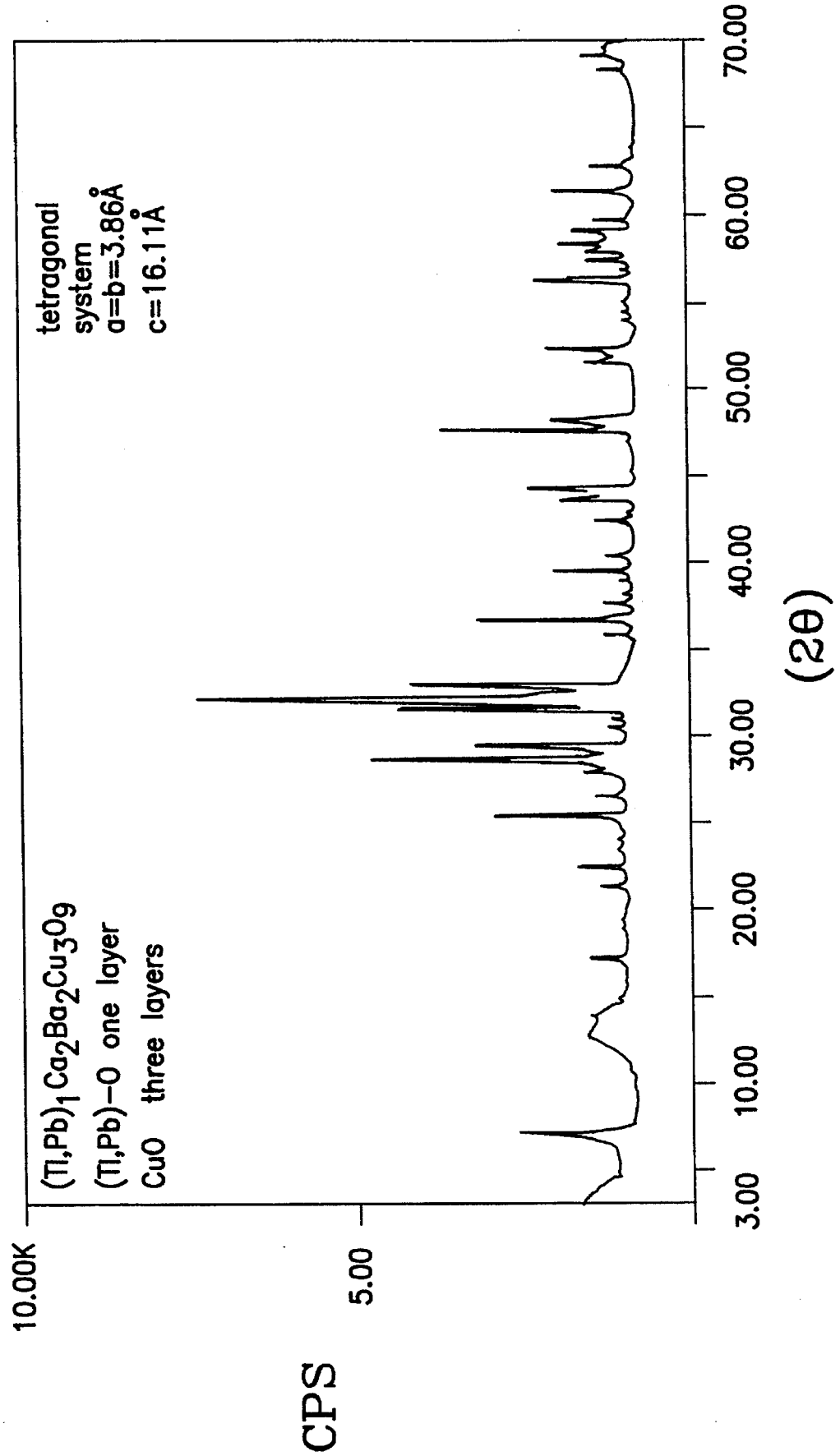
Figure 3:
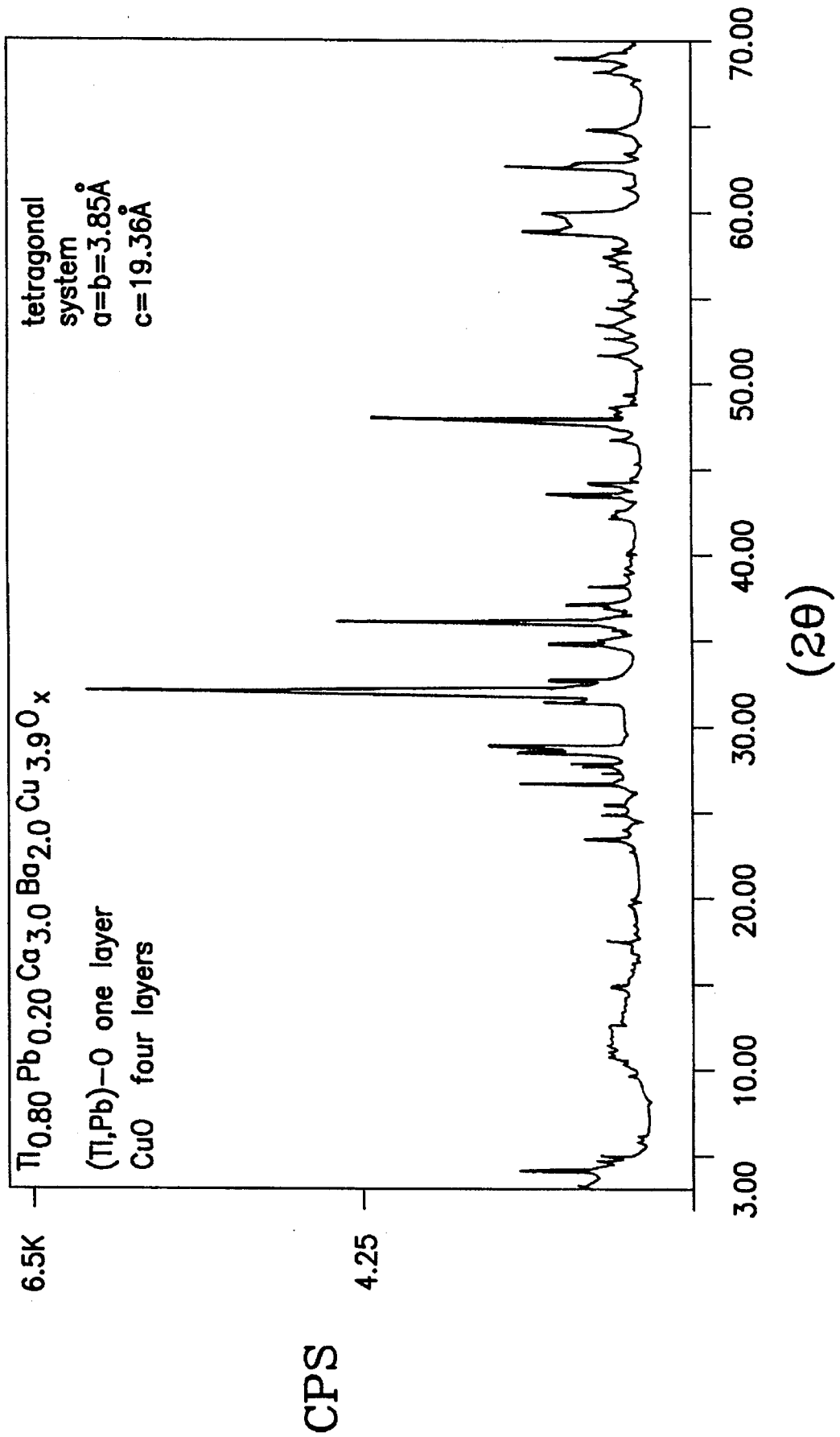
Figure 4:
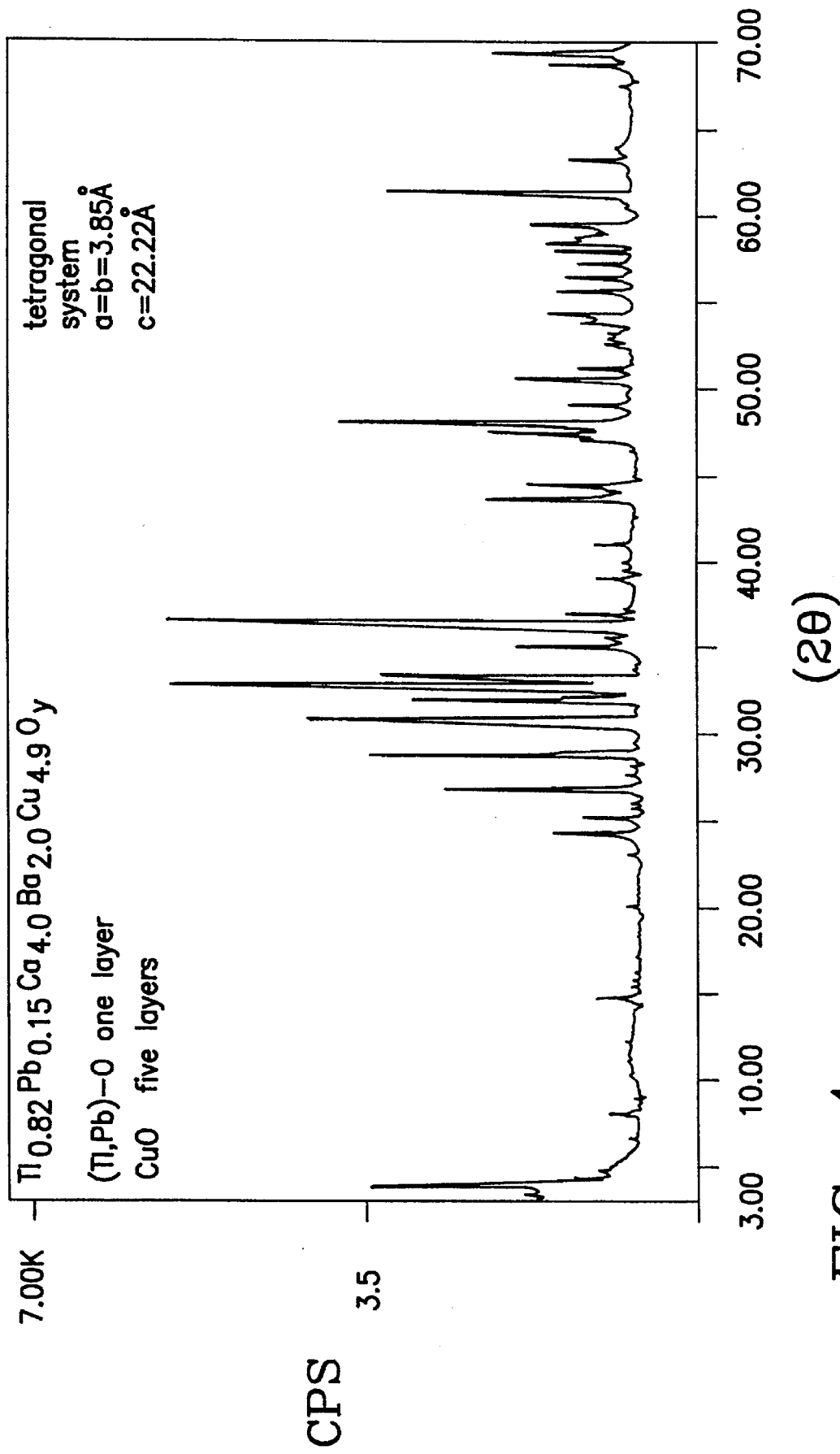
Figure 5:
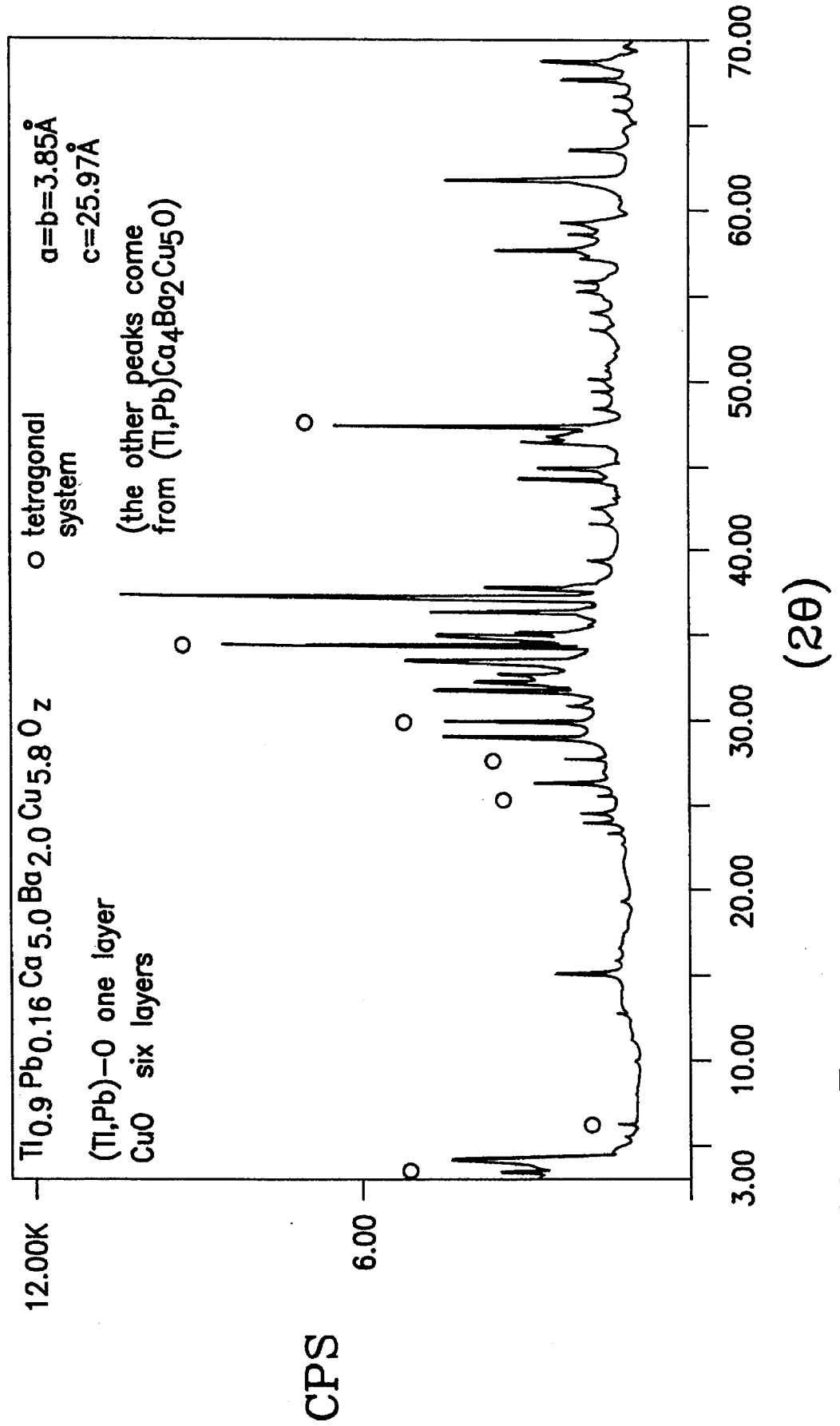
Figure 6:
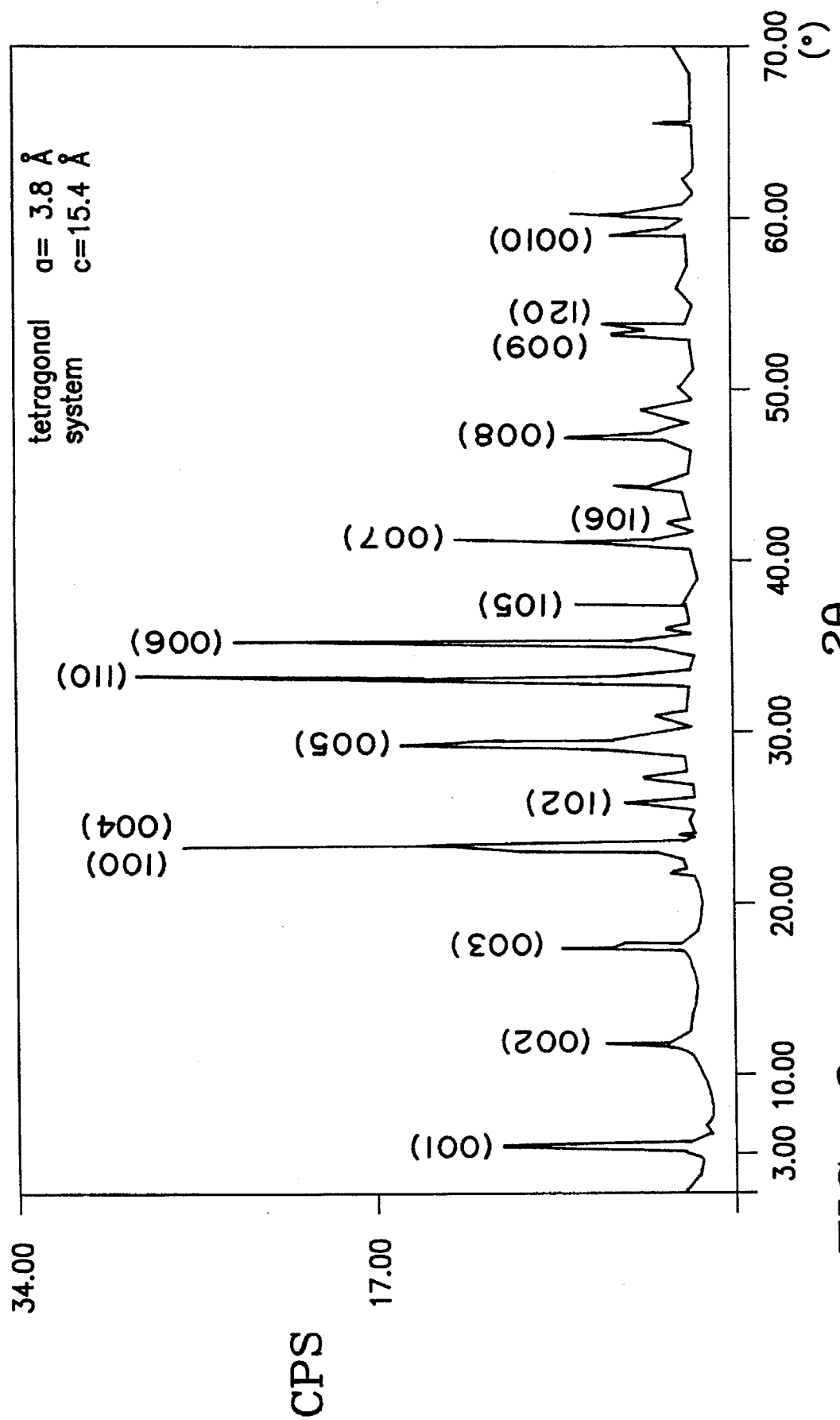
FIG. 6 is a X-ray diffraction chart of an oxide superconductor (Sample No. 6) obtained in Example 3 according to the present invention.
Figure 10:
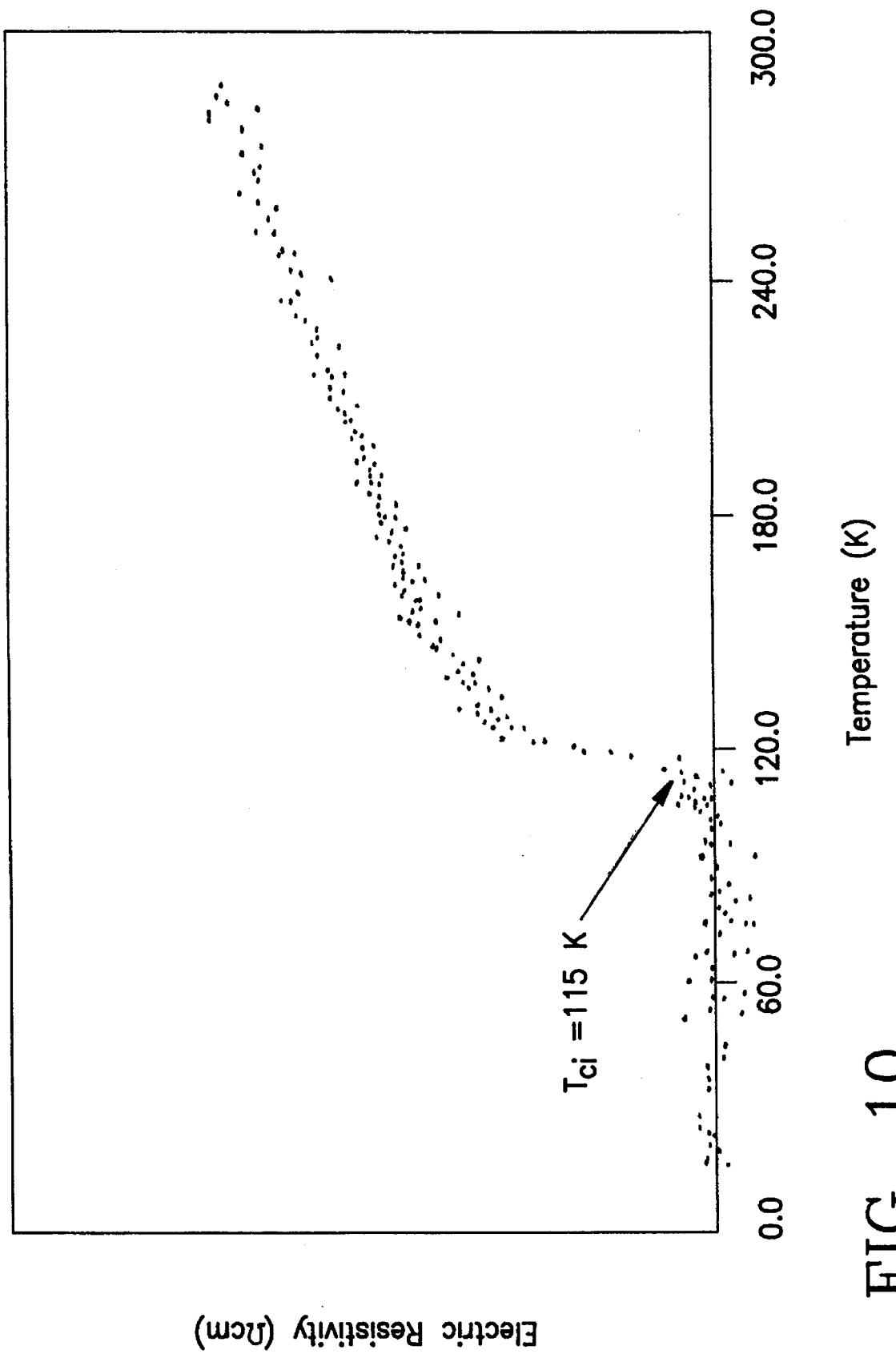
FIG. 10 shows a temperature dependency of electric resistance of an oxide superconductor (Sample No. 1) obtained in Example 3 according to the present invention.
Figure 11:
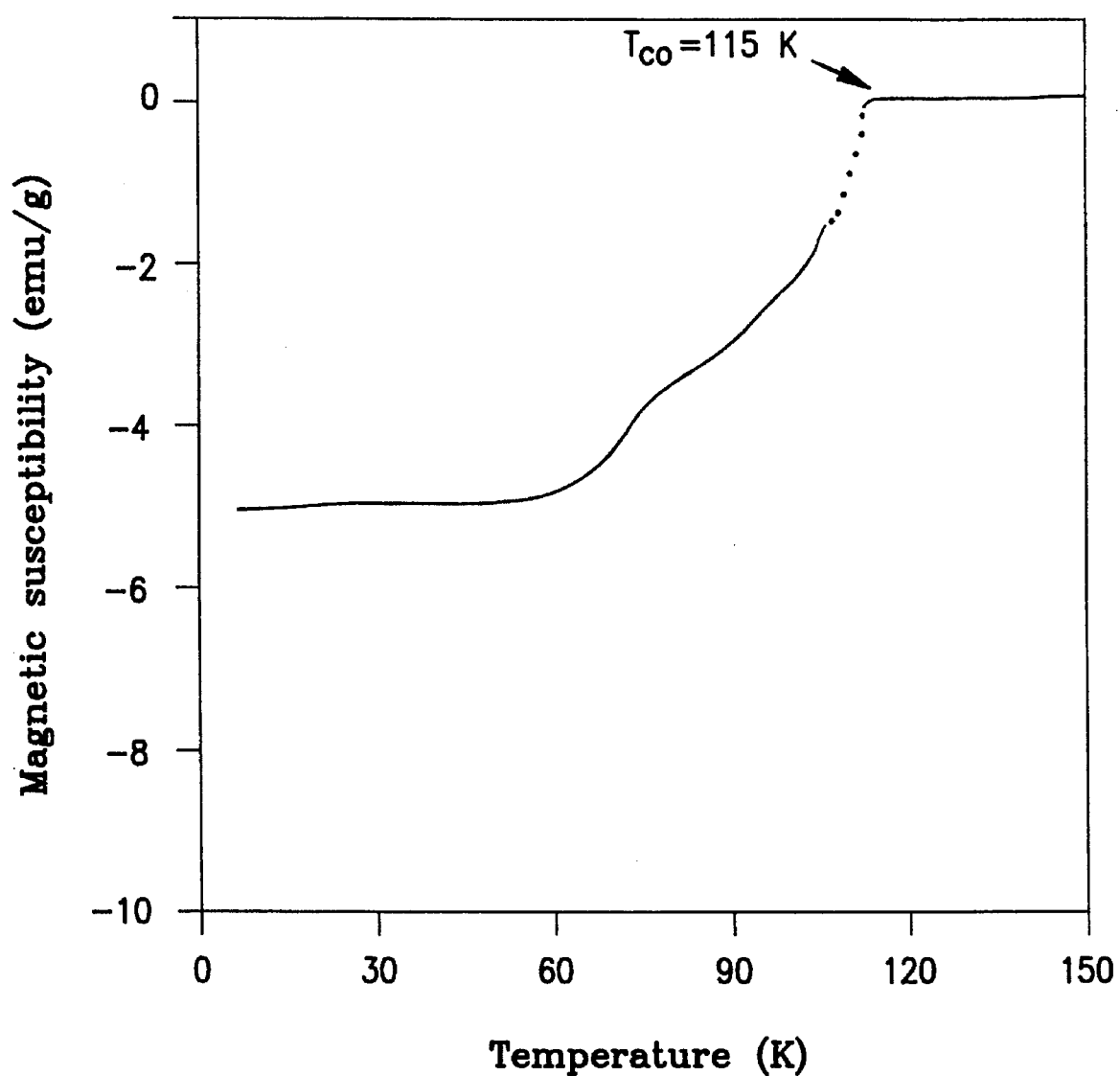
FIGS. 11 and 12 show respective temperature dependency of electric resistance and of magnetic susceptibility of an oxide superconductor (Sample No. 6) obtained in Example 3 according to the present invention.
Figure 12:
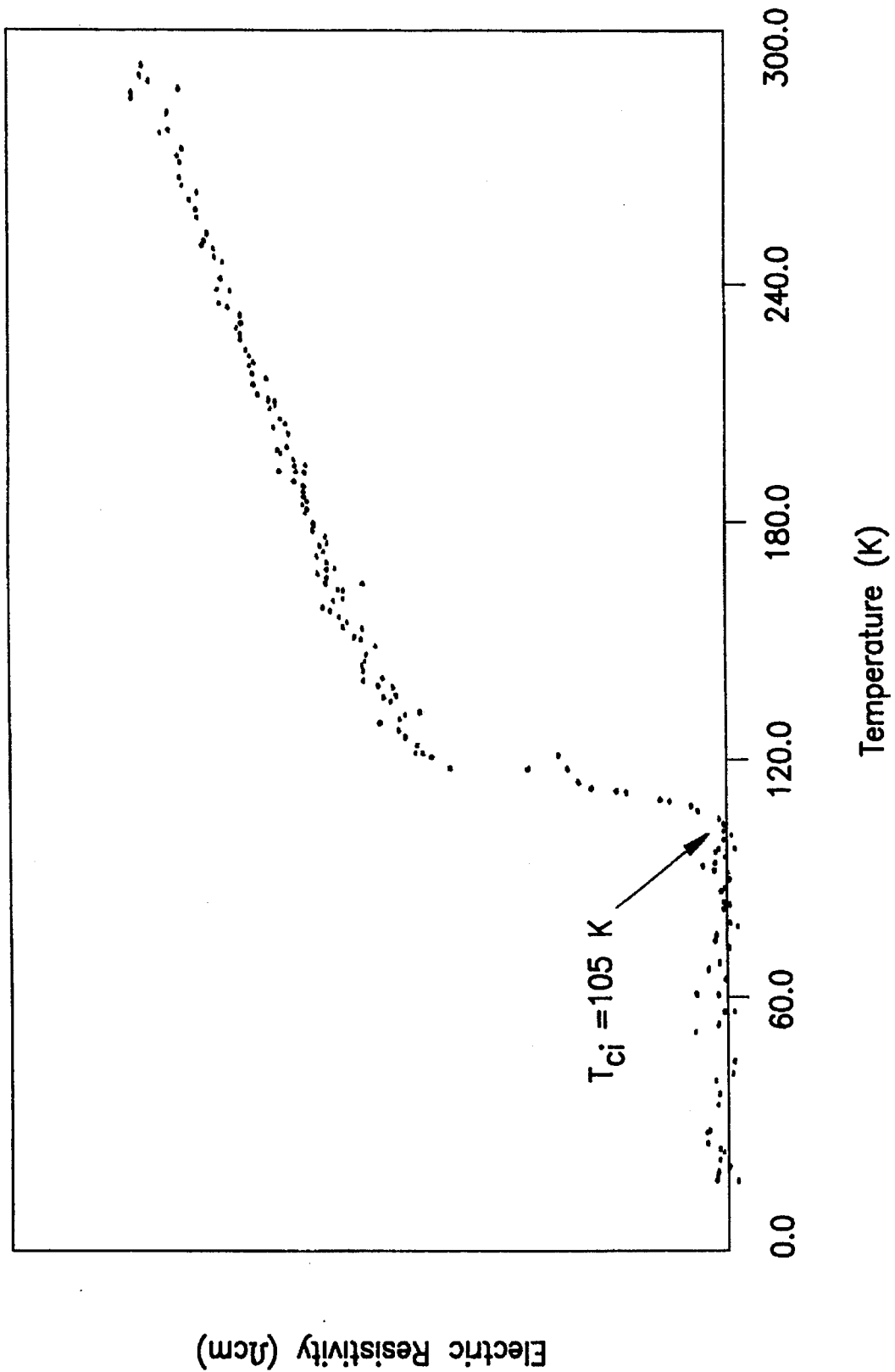

The ratios in the material powder mixture and the results of tests are also summarized in Table 3, 4 and 5. FIG. 10 shows a temperature dependency of electric resistance measured on the sample No. 1. FIG. 6 shows a X-ray diffraction chart obtained from the sample No. 6. FIGS. 11 and 12 show a temperature dependency of magnetic susceptibility and a temperature dependency of electric resistance obtained from the sample No. 6 respectively.

All of the oxide superconducting materials according to the present invention show much higher critical current density Jc than the known oxide superconducting material while same or even higher critical temperature Tc is observed.

TABLE 3(1)

| Sample No | Composition of the powder mixture | | | | | | Tci (K) | Jc (A/cm²) |
|---|---|---|---|---|---|---|---|---|
| | Tl | Bi | Pb | Sr | Ca | Cu | | |
| Example I | | | | | | | | |
| (1) | 0.8 | 0.2 | — | 2 | 2 | 3 | 115 | 900 |
| (2) | 0.7 | 0.3 | — | 2 | 2 | 3 | 100 | 450 |
| (3) | 0.6 | 0.4 | — | 2 | 2 | 3 | 105 | 550 |
| (4) | 0.4 | 0.6 | — | 2 | 2 | 3 | 100 | 500 |
| (5) | 0.2 | 0.8 | — | 2 | 2 | 3 | 98 | 400 |
| (6) | 1 | 1 | — | 2 | 2 | 3 | 105 | 780 |
| (7) | 0.6 | 0.3 | 0.1 | 2 | 2 | 3 | 108 | 650 |
| (8) | 0.56 | 0.24 | 0.2 | 2 | 2 | 3 | 110 | 700 |
| (9) | 0.42 | 0.18 | 0.4 | 2 | 2 | 3 | 113 | 750 |
| (10) | 0.35 | 0.15 | 0.5 | 2 | 2 | 3 | 110 | 680 |
| (11) | 0.28 | 0.12 | 0.6 | 2 | 2 | 3 | 108 | 650 |
| (12) | 0.21 | 0.09 | 0.7 | 2 | 2 | 3 | 80 | 90 |

Note: Tci is a temperature where perfect zero resistance was observed. The phase obtained was a tetragonal system having the lattice constant of a = 3.8 Å and c = 15.3 Å in all samples prepared.

TABLE 3(2)

| Sample No | Composition of the powder mixture | | | | | | Tci (K) | Jc (A/cm²) |
|---|---|---|---|---|---|---|---|---|
| | Tl | Bi | Pb | Sr | Ca | Cu | | |
| Comparative Example I | | | | | | | | |
| (13) | 0.9 | 0.1 | — | 2 | 2 | 3 | 78 | 10 |
| (14) | 0.1 | 0.9 | — | 2 | 2 | 3 | 80 | 100 |
| (15) | 0 | 2 | — | 2 | 2 | 3 | 80 | 90 |
| (16) | 1 | 0 | — | 2 | 2 | 3 | 75 | — |
| (17) | 0 | 1.6 | 0.4 | 2 | 2 | 3 | 103 | 120 |

Note: Tci is a temperature where perfect zero resistance was observed

TABLE 4

| Sample No | Composition of the powder mixture | | | | | | Tci (K) | Jc (A/cm²) |
|---|---|---|---|---|---|---|---|---|
| | Tl | Bi | Pb | Sr | Ca | Cu | | |
| Example II | | | | | | | | |
| (18) | 0.7 | 0.3 | — | 2 | 1 | 2 | 86 | 120 |
| (19) | 0.6 | 0.4 | — | 2 | 1 | 2 | 90 | 150 |
| (20) | 0.4 | 0.6 | — | 2 | 1 | 2 | 85 | 120 |
| (21) | 0.2 | 0.8 | — | 2 | 1 | 2 | 85 | 120 |
| (22) | 0.6 | 0.3 | 0.1 | 2 | 1 | 2 | 95 | 300 |

TABLE 4-continued

| Sample | Composition of the powder mixture | | | | | | Tci | Jc |
|---|---|---|---|---|---|---|---|---|
| No | Tl | Bi | Pb | Sr | Ca | Cu | (K) | (A/cm$^2$) |
| Comparative Example II | | | | | | | | |
| (23) | 0.9 | 0.1 | — | 2 | 1 | 2 | 78 | 10 |
| (24) | 0.1 | 0.9 | — | 2 | 1 | 2 | 78 | 20 |
| (25) | 0 | 2 | — | 2 | 1 | 2 | 78 | 20 |
| (26) | 1 | 0 | — | 2 | 1 | 2 | 75 | — |
| (27) | 0 | 1.6 | 0.4 | 2 | 1 | 2 | 90 | 180 |

Note: Tci is a temperature where perfect zero resistance was observed

TABLE 5

| Sample | Composition of the powder mixture | | | | | | Lattice constant | | Tci | Jc |
|---|---|---|---|---|---|---|---|---|---|---|
| No | Bi | Tl | Pb | Sr | Ca | Cu | (Å) | y | (K) | (A/cm$^2$) |
| Example III | | | | | | | | | | |
| (28) | 1.2 | 0.8 | — | 2 | 2 | 3 | a = 3.8<br>c = 15.3<br>tetragonal | 2 | 100 | 450 |
| (29) | 0.8 | 1.2 | — | 2 | 2 | 3 | a = 3.8<br>c = 15.3<br>tetragonal | 2 | 105 | 550 |
| (30) | 1.0 | 0.6 | 0.4 | 2 | 2 | 3 | a = 3.8<br>c = 15.8 | 2 | 110 | 500 |
| Comparative Example III | | | | | | | | | | |
| (31) | 2 | — | — | 2 | 2 | 3 | a = 5.41<br>c = 36.8<br>a = 5.41<br>c = 30.6 | — | 78 | 10 |
| (32) | 1.6 | 0.4 | — | 2 | 2 | 3 | a = 5.41<br>c = 36.8 | — | 103 | 120 |

Note: Tci is a temperature where perfect zero resistance was observed

EXAMPLE 4

Oxide superconducting materials according to the present invention were prepared by the process according to the present invention. Powders of $Tl_2O_3$, CaO, $BaO_2$, $Cs_2CO_3$ and CuO (purity is higher than 99.9%) used as materials were weighted and mixed in the proportions shown in Table 6 to prepare five samples of powder mixture. Then, the resulting powder mixtures were compacted into pellets. The resulting each pellet was wrapped with a gold foil and was sintered at a temperature of 850° C. for 12 hours in oxygen gas stream. For a comparison, a comparative superconducting material was prepared by sintering a powder mixture containing the same materials except $Cs_2CO_3$.

The resulting all samples of oxide superconductors were found that they contained compound oxide represented by the general formula:

$$Tl_yCa_z(Ba_{(1-r)}Cs_r)_vCu_vO_w$$

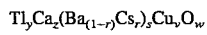

in which "y", "z", "v", "w", "r" and "s" are numbers each satisfying respective range of $0.5 \leq y \leq 3.0$, $0.5 \leq z \leq 4.0$, $2.0 \leq v \leq 5.0$, $5.0 \leq w \leq 15.0$, $0 \leq r \leq 0.8$ and $0.5 \leq s \leq 3.0$.

On the resulting oxide superconductors, the critical temperature Tc and the critical current density Jc at liquid nitrogen temperature were measured. The results are summarized in Table 6.

All of the oxide superconducting materials according to the present invention show much higher critical current density Jc than known oxide superconducting material while same or even higher critical temperature Tc is observed.

TABLE 6

| Sample | Composition of the powder mixture | | | | | Tci | Jc |
|---|---|---|---|---|---|---|---|
| No | Tl | Ca | Ba | Cs | Cu | (K) | (A/cm$^2$) |
| Comparative (1) | 2<br>2 | 2<br>2 | 2.0<br>1.95 | —<br>0.05 | 3<br>3 | 110<br>113 | 300<br>280 |

TABLE 6-continued

| Sample | Composition of the powder mixture | | | | | Tci | Jc |
|---|---|---|---|---|---|---|---|
| No | Tl | Ca | Ba | Cs | Cu | (K) | (A/cm$^2$) |
| (2) | 2 | 2 | 1.8 | 0.2 | 3 | 116 | 350 |
| (3) | 2 | 2 | 1.0 | 1.0 | 3 | 116 | 400 |
| (4) | 2 | 2 | 0.4 | 1.6 | 3 | 117 | 450 |
| (5) | 2 | 2 | 0.2 | 1.8 | 3 | —* | —* |

Note: * no superconductor above 4.2 K.

EXAMPLE 5

Oxide superconducting materials according to the present invention were prepared by the same process as Example 4 except that $Bi_2O_3$ and PbO were added additionally. The resulting oxide superconductor was evaluated by the same method as Example 4. Table 7 shows the composition of the material powder and the properties of the resulting oxide superconductor.

The resulting oxide superconducting material was found that it contained compound oxide represented by the general formula:

$(Tl_{(1-p-q)}Bi_pPb_q)_yCa_z(Ba_{(1-r)}Cs_r)_sCu_vO_w$ in which "y", "z", "v", "w", "p", "q", "r" and "s" are numbers each satisfying respective range of $0.5 \leq y \leq 3.0$, $0.5 \leq z \leq 4.0$, $2.0 \leq v \leq 5.0$, $5.0 \leq w \leq 15.0$, $0 \leq p \leq 0.5$, $0 \leq q \leq 0.5$, $0 \leq r \leq 0.8$ and $0.5 \leq s \leq 3.0$.

This oxide superconducting material according to the present invention shows much higher critical current density Jc than known oxide superconducting material while same or even higher critical temperature Tc is observed.

TABLE 7

| Sample No | \multicolumn{6}{c}{Composition of the powder mixture} | Tci (K) | Jc (A/cm²) |
|---|---|---|---|---|---|---|---|---|
|  | Tl | Bi | Pb | Ca | Ba | Cs | Cu | | |
| (6) | 1.6 | 0.2 | 0.2 | 2 | 1 | 1 | 3 | 116 | 350 |

EXAMPLE 6

Oxide superconducting materials according to the present invention were prepared by the same process as Example 4 except that $BaO_2$ is replaced by $SrO_2$. The resulting oxide superconductor was evaluated by the same method as Example 4. Table. 8 shows the composition of the material powder and the properties of the resulting oxide superconductor.

All of the resulting oxide superconducting materials were found that they contained compound oxide represented by the general formula:

$$Tl_yCa_z(Sr_{(1-r)}Cs_r)_sCu_vO_w$$

in which "y", "z", "v", "w", "r" and "s" are numbers each satisfying respective range of $0.5 \leq y \leq 3.0$, $0.5 \leq z \leq 4.0$, $2.0 \leq v \leq 5.0$, $5.0 \leq w \leq 15.0$, $0 \leq r \leq 0.8$ and $0.5 \leq s \leq 3.0$.

These oxide superconducting materials according to the present invention show much higher critical current density Jc than known oxide superconducting material while same or even higher critical temperature Tc is observed.

TABLE 8

| Sample No | \multicolumn{5}{c}{Composition of the powder mixture} | Tci (K) | Jc (A/cm²) |
|---|---|---|---|---|---|---|---|
|  | Tl | Ca | Sr | Cs | Cu | | |
| Comparative | 2 | 2 | 2.0 | — | 3 | 70 | — |
| (7) | 2 | 2 | 1.95 | 0.05 | 3 | 72 | — |
| (8) | 2 | 2 | 1.8 | 0.2 | 3 | 100 | 280 |
| (9) | 2 | 2 | 1.0 | 1.0 | 3 | 105 | 400 |

TABLE 8-continued

| Sample No | \multicolumn{5}{c}{Composition of the powder mixture} | Tci (K) | Jc (A/cm²) |
|---|---|---|---|---|---|---|---|
|  | Tl | Ca | Sr | Cs | Cu | | |
| (10) | 2 | 2 | 0.4 | 1.6 | 3 | 103 | 350 |
| (11) | 2 | 2 | 0.2 | 1.8 | 3 | —* | —* |

NB: * no superconductor above 4.2 K.

EXAMPLE 7

Oxide superconducting material according to the present invention was prepared by the same process as Example 6 except that $Bi_2O_3$ and PbO were added additionally. The resulting oxide superconductor was evaluated by the same method as Example 6. Table. 9 shows the composition of the material powder and the properties of the resulting oxide superconductor.

The resulting oxide superconducting material was found that it contained compound oxide represented by the general formula:

$$(Tl_{(1-p-q)}Bi_pPb_q)_yCa_z(Sr_{(1-r)}Cs_r)_sCu_vO_w$$

in which "y", "z", "v", "w", "p", "q", "r" and "s" are numbers each satisfying respective range of $0.5 \leq y \leq 3.0$, $0.5 \leq z \leq 4.0$, $2.0 \leq v \leq 5.0$, $5.0 \leq w \leq 15.0$, $0 \leq p \leq 0.5$, $0 \leq q \leq 0.5$, $0 \leq r \leq 0.8$ and $0.5 \leq s \leq 3.0$.

The oxide superconducting material according to the present invention show much higher critical current density Jc than known oxide superconducting material while same or even higher critical temperature Tc is observed.

TABLE 9

| Sample No | \multicolumn{6}{c}{Composition of the powder mixture} | Tci (K) | Jc (A/cm²) |
|---|---|---|---|---|---|---|---|---|
|  | Tl | Bi | Pb | Ca | Sr | Cs | Cu | | |
| (12) | 1.6 | 0.2 | 0.2 | 2 | 1 | 1 | 3 | 108 | 380 |

We claim:

1. Superconducting compound oxide represented by the general formula (II):

$$(Tl_{(1-p-q)}Bi_pPb_q)Sr_2Ca_2Cu_3O_w \qquad (II)$$

in which small letters w, p, and q are numbers each satisfying respective ranges of $5.0 \leq w$, $0.12 \leq p \leq 0.3$, and $0.1 \leq q \leq 0.6$.

* * * * *